United States Patent [19]

Ghezzo et al.

[11] Patent Number: 4,583,281
[45] Date of Patent: Apr. 22, 1986

[54] METHOD OF MAKING AN INTEGRATED CIRCUIT

[75] Inventors: Mario Ghezzo, Ballston Lake; Manjin J. Kim, Schenectady, both of N.Y.

[73] Assignee: General Electric Company, Schenectady, N.Y.

[21] Appl. No.: 711,333

[22] Filed: Mar. 13, 1985

[51] Int. Cl.⁴ ............................................ H01L 21/95
[52] U.S. Cl. ................................. 29/576 W; 29/580; 148/DIG. 86; 148/DIG. 114; 148/DIG. 117; 156/643; 156/649; 357/50; 427/93; 427/94
[58] Field of Search ..................... 29/576 W, 571, 580; 148/DIG. 85, DIG. 86, DIG. 114, DIG. 117; 156/643, 649; 357/23.11, 50, 54; 427/93, 94

[56] References Cited

U.S. PATENT DOCUMENTS

| | | | |
|---|---|---|---|
| 3,958,040 | 5/1976 | Webb | 427/94 |
| 4,271,583 | 6/1981 | Kahng et al. | 29/576 W X |
| 4,333,964 | 6/1982 | Ghezzo | 427/93 |
| 4,333,965 | 6/1982 | Chow et al. | 427/93 |
| 4,462,846 | 7/1984 | Varshney | 29/576 W X |

Primary Examiner—Brian E. Hearn
Assistant Examiner—Alan E. Schiavelli
Attorney, Agent, or Firm—Lawrence D. Cutter; James C. Davis, Jr.; Marvin Snyder

[57] ABSTRACT

A method of forming in a silicon substrate an active region bounded by a field of silicon dioxide is described. On top of a mesa formed in the silicon substrate is provided a three layered structure including a first thin layer of silicon dioxide in contact with the top of the mesa, a second thicker layer of silicon nitride overlying the thin layer of silicon dioxide and a third layer of silicon dioxide overlying the layer of silicon nitride. A further layer of silicon nitride is formed over the three layered structure and the exposed surfaces of the silicon substrate. Spacer portions of silicon nitride are formed on the sides of the mesa and the three layered structure by anisotropically etching the fourth layer of silicon nitride. By controlling the thicknesses of the first, second and third layers, the width of the spacer portions is optimized to prevent lateral oxidation of the active region. By optimizing the thicknesses of the first and second layers of the three layered structure, lattice stresses in the active region resulting from thermal cycling of the device having layers with different thermal coefficients of expansion are reduced during field oxidation.

7 Claims, 8 Drawing Figures

METHOD OF MAKING AN INTEGRATED CIRCUIT

The present invention relates in general to a method of making an integrated circuit and in particular to a method of forming an electrically isolated region bounded by a contiguous, thick layer of silicon dioxide on a major surface of a silicon semiconductor substrate.

BACKGROUND OF THE INVENTION

A typical integrated circuit comprises a plurality of electrically isolated active regions located on a common silicon semiconductor substrate. The active regions are generally formed by masking the substrate with patterned layers of silicon dioxide and silicon nitride to form the active regions under the patterned layers. The active regions are electrically isolated by oxidizing the exposed substrate surfaces to selectively form a thick field oxide, and then further processed to produce active components such as transistors.

In forming the active regions, a thin silicon dioxide layer is formed directly on the substrate and a thick silicon nitride layer is formed over the silicon dioxide layer. The silicon dioxide layer serves to buffer any mismatch in thermal expansion which occurs between the substrate and the silicon nitride layer during the substrate oxidation process, thereby minimizing crystallographic defects in the substrate. The thick layer of silicon nitride acts as a barrier to prevent oxidation of the active region during the oxidation of the exposed substrate surfaces.

The method described above is plagued by the passage of oxygen laterally through the thin layer of silicon dioxide and into the active region, resulting in "bird's beak" formations of silicon dioxide along the edges of the active regions. These "bird's beak" formations alter the shape and area of the active regions, reducing the usable area of the substrate.

Ghezzo U.S. Pat. No. 4,333,964, assigned to the instant assignee, shows a method of minimizing "bird's beak" formations by using a multilayer structure including a very thin layer of silicon nitride in direct contact with the substrate to inhibit the oxidation of the active regions near the edges from the lateral flow of oxygen. The use of the additional thin nitride layer, however, reduces, but does not eliminate completely the crystallographic defects resulting from the thermal expansion mismatch described above.

Chow and Ghezzo U.S. Pat. No. 4,333,965, assigned to the instant assignee, shows another method of minimizing "bird's beak" formations by forming oxygen masking spacers of silicon nitride over the sidewalls of the active region mesa, the spacers inhibiting lateral oxidation of the mesa. The method taught by this patent, however, has the disadvantage of producing spacers too thin to entirely block the lateral oxidation. Moreover, this method requires substantial etching of the substrate to form mesas in the active region, thereby complicating the fabrication process.

OBJECTS OF THE INVENTION

It is a principal object of the present invention to provide a method of forming electrically isolated regions on the surface of a semiconductor substrate which is not subject to the aforementioned problems and disadvantages.

Another object of the present invention is to provide a method of forming electrically isolated regions on the surface of a semiconductor substrate which minimizes "bird's beak" formations.

A further object of the present invention is to provide a method of forming electrically isolated regions on the surface of a semiconductor substrate which minimizes crystallographic defects in the regions.

Another object of the present invention is to provide a method of forming electrically isolated regions on the surface of a semiconductor substrate which allows the separate optimization of the conditions favorable to minimizing "bird's beak" formations and the conditions favorable to minimizing crystallographic defects.

Yet another object of the present invention is to provide a relatively simple method of forming electrically isolated regions on the surface of a silicon semiconductor substrate which is compatible with known, integrated circuit processing techniques.

Other objects of the invention will in part be obvious and in part appear hereinafter.

SUMMARY OF THE INVENTION

The foregoing objects of the invention are achieved through the use of a new and improved method of forming electrically isolated regions on the surface of a silicon semiconductor substrate. The inventive method is relatively simple to implement and compatible with known semiconductor processing techniques.

In accordance with the present invention, first, second and third layers, comprising respectively a buffer material such as silicon dioxide, an oxygen masking material such as silicon nitride and a filler material such as silicon dioxide, are formed successively over the major surface of a substrate of semiconductor material. The exposed surface of the multilayer structure is then patterned, for example, using a photolithographic masking and etching process, to selectively remove portions of each layer. The result is a plateau of overlying first, second and third layers, the plateau having nearly vertical side walls and being in registry with a desired region of the substrate. The etching process is continued into the exposed portions of the substrate major surface to form the desired region into the shape of a mesa, the mesa being in registry with and constituting the base of the plateau.

Subsequent to the formation of the mesa, a fourth layer of silicon nitride is conformally deposited over the exposed surfaces of the substrate and plateau and is selectively removed to leave retained portions, herein called spacers, covering the sidewalls of the mesa and plateau. The retained portion of the third layer is removed, and the substrate is then heated in an oxidizing atmosphere to cause the exposed portions thereof to be converted to an electrically isolating field of silicon dioxide. The spacers and retained portions of the plateau are then removed to prepare the structure for further processing.

By controlling the thicknesses of the first, second, third and fourth layers, the width of the spacer portions which cover the mesa sidewalls is optimized to minimize the "bird's beak" formations described above. Further, the thicknesses of the retained portions of the first and second layers are optimized to reduce the stresses in the substrate lattice which occur during field oxidation.

These and other objects of the invention, as well as the features and advantages thereof, will become apparent from the following detailed description when read in conjunction with the accompanying drawings. Like reference numerals refer to corresponding parts throughout the several views.

DETAILED DESCRIPTION

Figure 1:
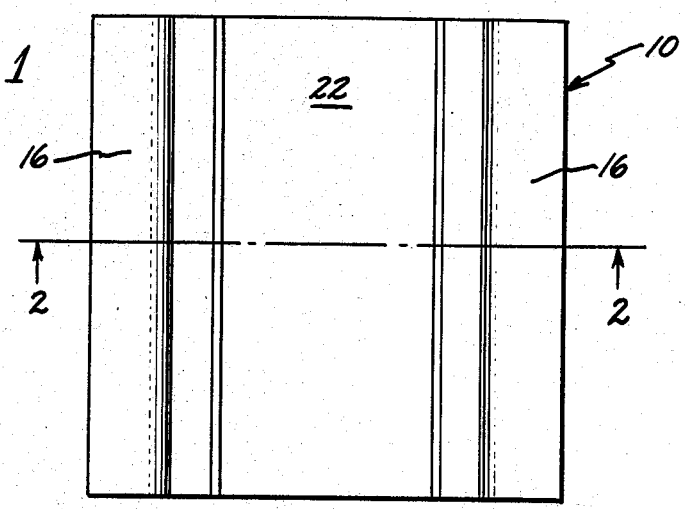
FIG. 1 is a plan view of a composite structure representing a section of an integrated circuit fabricated in accordance with the present invention.
Figure 2:
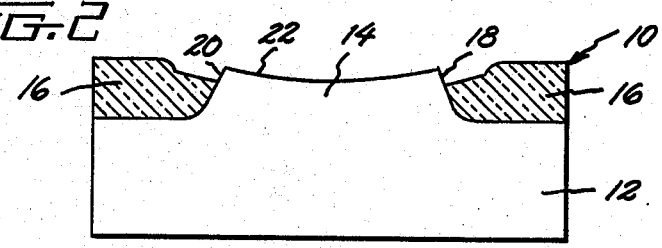
FIG. 2 is a cross-sectional view of FIG. 1 taken along line 2—2.

Referring now to FIGS. 1 and 2, a composite structure 10 representative of a section of an integrated circuit is shown to include a silicon semiconductor substrate 12 having an active region 14 bounded by a thick, contiguous, electrically isolating field of silicon dioxide 16. Silicon dioxide field 16 is seen to bound active region 14 along a pair of edges 18 and 20 and not to overlap onto the surface 22 of the active region, thus avoiding the "bird's beak" formation described above.

Figure 3A:
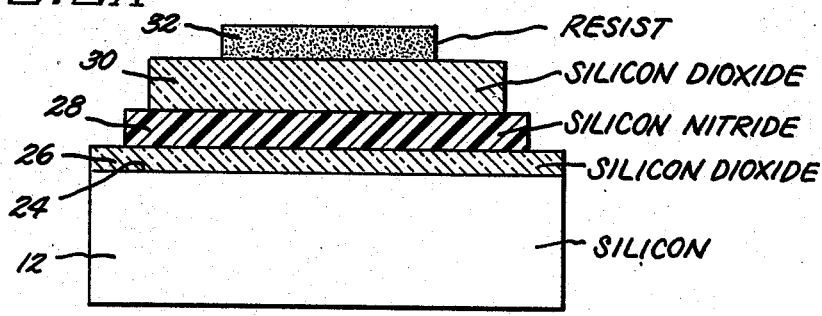
FIGS. 3A–3F show cross-sectional views of composite structures representing successive steps in a method of fabricating the composite structure of FIGS. 1 and 2 in accordance with the present invention.

The method of fabricating the composite structure, illustrated in FIGS. 1 and 2 in accordance with the present invention, will now be described with reference to FIGS. 3A–3F. FIG. 3A shows a silicon semiconductor substrate 12 having, for example, 10 ohm - cm resistivity and N-type conductivity. Substrate 12 includes a major surface 24 which is parallel to a (100) crystallographic plane of the substrate. A first layer 26 of silicon dioxide, having a thickness of approximately 300 angstroms, is formed on substrate 12. First layer 26 can be formed by techniques well known in the art, for example, exposing the substrate in an ambient of oxygen at a temperature and for a time to form a layer of silicon dioxide of the desired thickness. A second layer 28 of silicon nitride, having a thickness of approximately 800 angstroms, is formed on silicon dioxide layer 26. The silicon nitride layer can be formed by techniques well known in the art, for example, by low pressure chemical vapor deposition utilizing vapors of silane and ammonia under appropriate conditions. A third layer 30, also of silicon dioxide and having a thickness of approximately 3000 angstroms, is formed on silicon nitride layer 28 by techniques well known in the art, for example, by chemical vapor deposition utilizing vapors of silane and nitrous oxide under appropriate conditions. A resist pattern 32 is then formed on silicon dioxide layer 30 using photolithographic masking techniques known in the art.

Figure 3B:
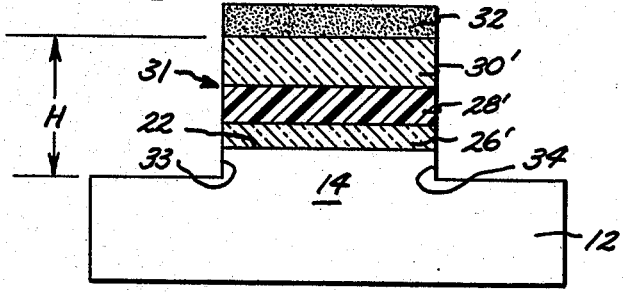

Reactive ion etching techniques known in the art are then used to pattern layers 30, 28 and 26 leaving respective retained portions 30', 28' and 26' thereof overlying and in registry with active region 14 as shown in FIG. 3B. An etchant suitable for etching silicon dioxide is $CHF_3$ in a carrier gas of argon. An etchant suitable for etching silicon nitride is $SF_6$ in a carrier gas of argon. This etching process is continued into the surface of substrate 12 exposed by the patterning, resulting in active region 14 taking the shape of a mesa having a top surface 22 and a pair of nearly vertical sidewalls 33 and 34. An etchant suitable for etching silicon is $CCl_4$ in a carrier gas of nitrogen. Mesa 14 thus forms the base of a plateau 31, the plateau further including the retained portions of the first, second and third layers and having a total height H.

Figure 3C:
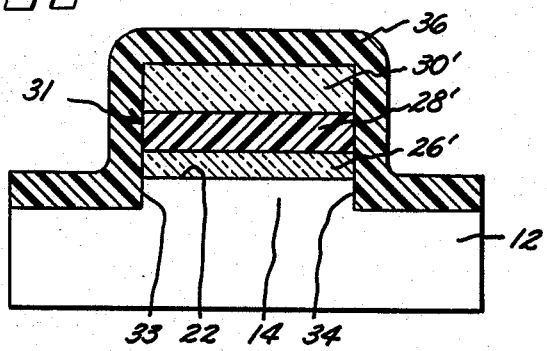

After removing resist pattern 32, a conformal fourth layer 36 of silicon nitride, having a thickness of approximately 2500 angstroms, is formed, by techniques well known in the art as mentioned above, over the exposed surfaces of substrate 12 and plateau 13, including mesa sidewalls 32 and 34. FIG. 3C illustrates the composite structure including the fourth layer 36 of silicon nitride.

Figure 3D:
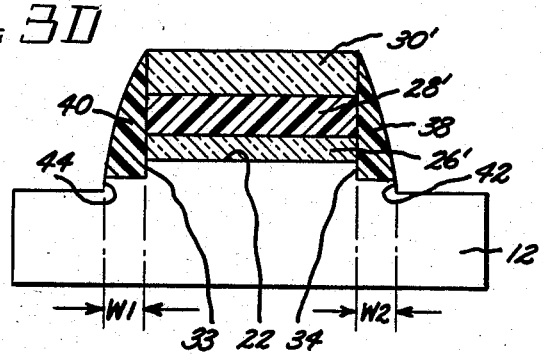
Figure 3E:
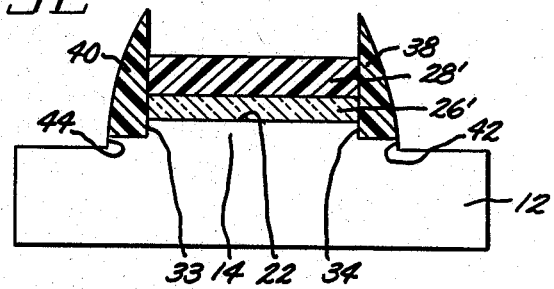

Fourth layer 36 is then anisotropically etched, for example, by maskless reactive ion etching technique well known in the art, leaving silicon nitride spacers 38 and 40 covering the plateau sidewalls including mesa sidewalls 33 and 34. As shown in FIG. 3D, the spacers have respective base widths of W1 and W2, the spacer bases being contiguous with the mesa sidewalls. In the preferred embodiment of the invention the spacer base widths are substantially identical. In order to assure the removal of all of the silicon nitride layer 36 excepting the spacers, the etching process is allowed to continue a relatively small depth into substrate 12, producing a second pair of substrate sidewalls 42 and 44. The retained portion 30' of silicon dioxide is then removed, for example by etching with a 5% HF solution, to produce the structure shown in FIG. 3E.

Figure 3F:
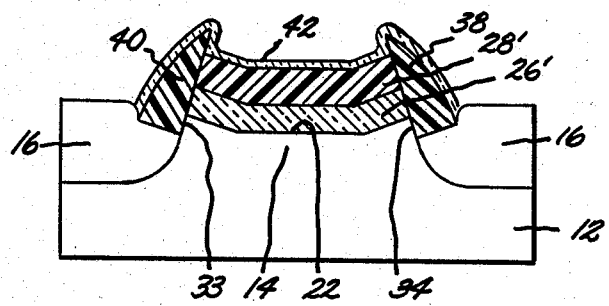

The exposed surfaces of substrate 12 are then oxidized using oxidation techniques well known in the art. The result is a silicon dioxide field 16, as shown in FIG. 3F, formed preferably to a thickness approximately in the range of 6,000–8,000 Angtroms. As a result of this oxidation process, a relatively thin layer 42 of silicon dioxide is also formed over the exposed surface of the retained portion 28' of second layer 28 and sidwall spacers 38 and 40. Further, the oxidation field 16 extends under the bases of spacers 38 and 40, exerting forces which cause surface 22 of region 14 to assume a concave shape. The oxidation field does not, however, extend laterally onto the surface of region 14, such lateral oxidation of the region being effectively inhibited by the spacers. Retained portions 26' and 28' of layers 26 and 28 and sidewall spacers 38 and 40 are subsequently removed, using appropriate etching techniques well known in the art, to produce the composite structure illustrated in FIGS. 1 and 2. The exposed surfaces of the silicon substrate are oxidized to form a thin layer of silicon dioxide thereover and thereafter subjected to further processing to form a device in the active region 14.

An important feature of the present invention is the ability to separately optimize both the base widths W1 and W2 of the sidewall spacers and the thicknesses of first and second layers 26 and 28. This is accomplished by controlling the thicknesses of the various layers in the manner described below.

Spacers 38 and 40 are optimized to inhibit the "bird's beak" formations discussed above by making them of a sufficient base width to inhibit lateral oxidation of active region 14. The maskless reactive ion etching used on the structure shown in FIG. 3C to remove fourth silicon nitride layer 36 and produce the spacers, generally progresses vertically downward. Thus, the spacers will theoretically tend to have identical base widths approximately equal to the thickness of the fourth layer. However, in practice, the etchant will have the maximum efficiency of an angle of incidence with the surface between 30 and 45 degrees, causing the actual width of the spacer bases to be the lesser of about two-thirds the height H of the plateau, or the full thickness of the fourth layer of silicon nitride. Thus, the height of plateau 31 and the thickness of fourth layer 36 must both be selected to produce the desired spacer base width.

The combined thickness of the first and second layers 26 and 28, while affecting the spacer base width in the manner described above, is separately optimized to reduce the formation of crystallographic defects in active region 14. These defects are caused by the mismatch in thermal expansion coefficients between substrate 12 and second silicon nitride layer 28, but are minimized by the use of a buffer layer of silicon dioxide. Experimentation has shown that restricting the thickness of second layer 28 of silicon nitride to less than three times that of the first layer 26 reduces the number of crystallographic defects to an acceptable level.

In summary, the benefits of the invention are achieved by selecting the height of the mesa and the thicknesses of the various plateau layers in the manner described above. A further, practical restriction is that of keeping the height of the mesa sidewalls 33 and 34 relatively short. If the mesa is made too high, thermal stresses incurred between the spacers and the substrate at the time of oxidation of the exposed substrate surfaces cause crystal lattice defects around the mesa.

The method of the present invention is practically implemented by first selecting a desired spacer base width. Next the thicknesses of the first and second layers are selected and optimized in the manner described above. The height of the mesa sidewalls is then selected to be sufficient such that the spacers will block lateral oxidation of the region, while being short enough to prevent crystallographic defects. Finally, the thicknesses of the third and fourth layers are selected to produce the desired spacer base width. Since retained portion 30' of third layer 30 is removed prior to oxidation, its thickness can be selected based solely on the desired spacer base width and practical technological limitations. The inclusion of the third layer to optimize the spacer base widths is an important feature of the present invention and provides an improvement over the method disclosed in above-noted U.S. Pat. No. 4,333,965 for eliminating the "bird's beak" problem.

The use of the inventive method is illustrated in the following analysis of the parameters selected for the preferred embodiment of the invention.

The preferred embodiment of the invention includes the selection of the various parameters necessary to form active regions, such as region 14, in the process of fabricating a metal oxide semiconductor (MOS) integrated circuit (IC) with 1 micron features. These MOS IC's generally require an insulating oxide field, in this case silicon dioxide field 16, having a thickness approximately in the range of 6,000–8,000 angstroms. Spacer widths of approximately 2,500 angstroms have been found to be sufficient to prevent lateral oxidation of region 14 during the field oxidation process. Thus, the lesser of two-thirds the height H of plateau 31, or the thickness of fourth layer 36, determines the spacer thickness and must meet or exceed the requisite 2,500 angstroms.

The requisite spacer width is obtained by forming second silicon nitride layer 28 to a thickness of 800 angstroms, less than three times the 300 angstroms thickness of first silicon dioxide layer 26. Third silicon dioxide layer 30 is formed to a relatively large thickness of 3,000 angstroms, in this case approximately two and one-half times the combined thickness of the first and second layers. Mesa 14 is selected to have a sidewall height in the range of 500–1,000 angstroms. Since two-thirds the height H of plateau 31 is greater than the thickness of fourth silicon nitride layer 36 i.e. $\frac{2}{3}[500+300+800+3000] \approx 3,000$ angstroms, the spacer bases will have the desired width of 2,500 angstroms, which in the preferred embodiment is equal to the thickness of the fourth layer of silicon nitride.

While in the preferred embodiment of the invention illustrated and described above, a silicon substrate having N-type conductivity is used, it will be appreciated that P-type conductivity substrates can be used. All of the various heights and thicknesses have been selected based on the implementation of a 1 micron MOS IC process and will, of course, be changed as required for different implementations. Also, the deposition and etching processes described are exemplary, and other suitable processes may be substituted therefor.

Although in the embodiment of the invention described above, spacer widths of approximately 2,500 angstroms were utilized, spacers of silicon nitride thicker than about 800 angstroms would prevent significant lateral oxidation of active regions of the silicon substrate.

In the process described above, the mesas formed in the substrate could be eliminated to simplify the process, if desired. In other respects the process would be the same.

While a preferred embodiment of the invention has been illustrated and described, it will be obvious that it is not so limited. Numerous modifications, changes, variations, substitutions and equivalents will occur to those skilled in the art without departing from the spirit and scope of the invention, as mentioned above. Accordingly, it is intended that the invention herein be limited only by the scope of the appended claims.

What is claimed is:

1. A method of forming an electrically isolated region on a major surface of a silicon semiconductor substrate, said method comprising the steps of:
   providing said substrate of silicon semiconductor material having a major surface;
   forming a first layer of silicon dioxide on said major surface of said substrate;
   forming a second layer of silicon nitride on said first layer, said second layer being substantially thicker than said first layer;
   forming a third layer of silicon dioxide on said second layer, said third layer being substantially thicker than said second layer;
   patterning said first, second and third layers to leave retained portions thereof overlying said region;
   forming a fourth layer of silicon nitride over the exposed surfaces of said substrate and said retained portions of said first, second and third layers;
   selectively removing said fourth layer to leave retained portions thereof covering the sidewalls of said retained portions of said first, second and third layers;
   removing said retained portion of said third layer; and
   heating said substrate in an oxidizing atmosphere to a temperature and for a time to convert the exposed surfaces thereof bounding said region into a field of silicon dioxide.

2. The method of claim 1 including removing said retained portions of said first, second and fourth layers.

3. The method of claim 1 in which the selective removal of said fourth layer is performed by anisotropically etching.

4. A method of forming an electrically isolated region on a major surface of a silicon semiconductor substrate, said method comprising the steps of:
   providing said substrate of silicon semiconductor material having a major surface;
   forming a first layer of silicon dioxide on said major surface of said substrate;
   forming a second layer of silicon nitride on said first layer, said second layer being substantially thicker than said first layer;
   forming a third layer of silicon dioxide on said second layer, said third layer being substantially thicker than said second layer;
   patterning said first, second and third layers to leave retained portions thereof overlying said region;
   selectively removing a portion of said substrate to form said region into the shape of a mesa;
   forming a fourth layer of silicon nitride over the exposed surfaces of said substrate and said retained portions of said first, second and third layers, including the walls of said mesa;
   selectively removing said fourth layer to leave retained portions thereof covering the sidewalls of said mesa and the sidewalls of said retained portions of said first, second and third layers;
   removing said retained portion of said third layer; and
   heating said substrate in an oxidizing atmosphere to a temperature and for a time to convert the exposed surfaces thereof bounding said region into a field of silicon dioxide.

5. The method of claim 4 in which the selective removal of said fourth layer is performed by anisotropically etching.

6. The method of claim 4 including removing said retained portions of said first, second and fourth layers.

7. The method of claim 4 wherein:
   said second layer has a relative thickness of less than three times the thickness of said first layer.

* * * * *